United States Patent [19]

Sano

[11] Patent Number: 5,398,163
[45] Date of Patent: Mar. 14, 1995

[54] FLEXIBLE PRINTED CIRCUIT BOARD

[75] Inventor: Masaki Sano, Tokyo, Japan

[73] Assignee: Asahi Kogaku Kogyo Kabushiki Kaisha, Tokyo, Japan

[21] Appl. No.: 86,852

[22] Filed: Jul. 7, 1993

[30] Foreign Application Priority Data

Jul. 8, 1992 [JP] Japan .................. 4-047716 U

[51] Int. Cl.6 .............................................. H05K 1/00
[52] U.S. Cl. ................................... 361/749; 361/748; 361/785; 361/801; 361/816; 174/35 R; 174/260; 439/67
[58] Field of Search .............. 361/748, 749, 752, 759, 361/785, 801, 802, 800, 816; 174/260, 261, 35 R; 439/67, 31

[56] References Cited

U.S. PATENT DOCUMENTS 5,012,273 4/1991 Nakamura et al. .
5,079,577 1/1992 Nomura .

Primary Examiner—Leo P. Picard
Assistant Examiner—Young Whang
Attorney, Agent, or Firm—Sandler Greenblum & Bernstein

[57] ABSTRACT

A flexible printed circuit board is provided including a flexible sheet having at least one electrically conductive layer, with a printed circuit pattern and a fold retainer pattern formed in one of the electrically conductive layers. The fold retainer pattern is electrically isolated from the printed circuit pattern. The fold retainer pattern has notches that indicate where the sheet is to be folded when the flexible sheet is folded, it is held in its folded shape by the fold retainer pattern.

20 Claims, 3 Drawing Sheets

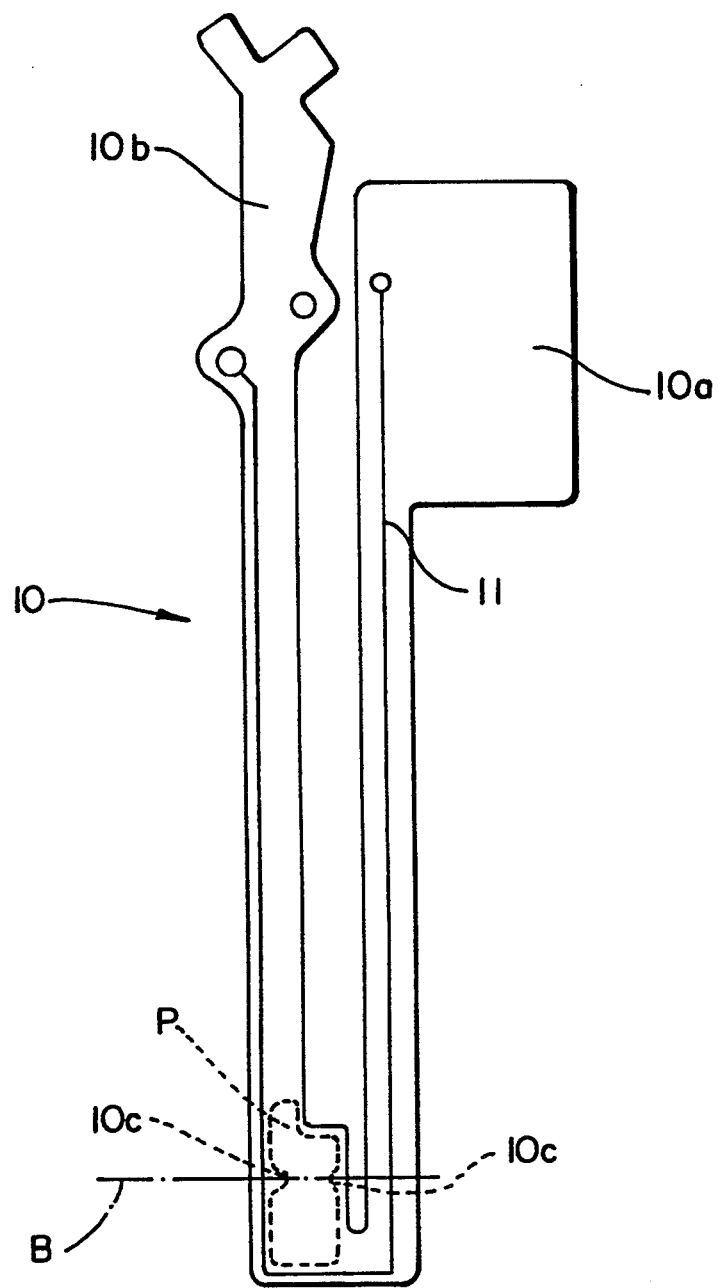

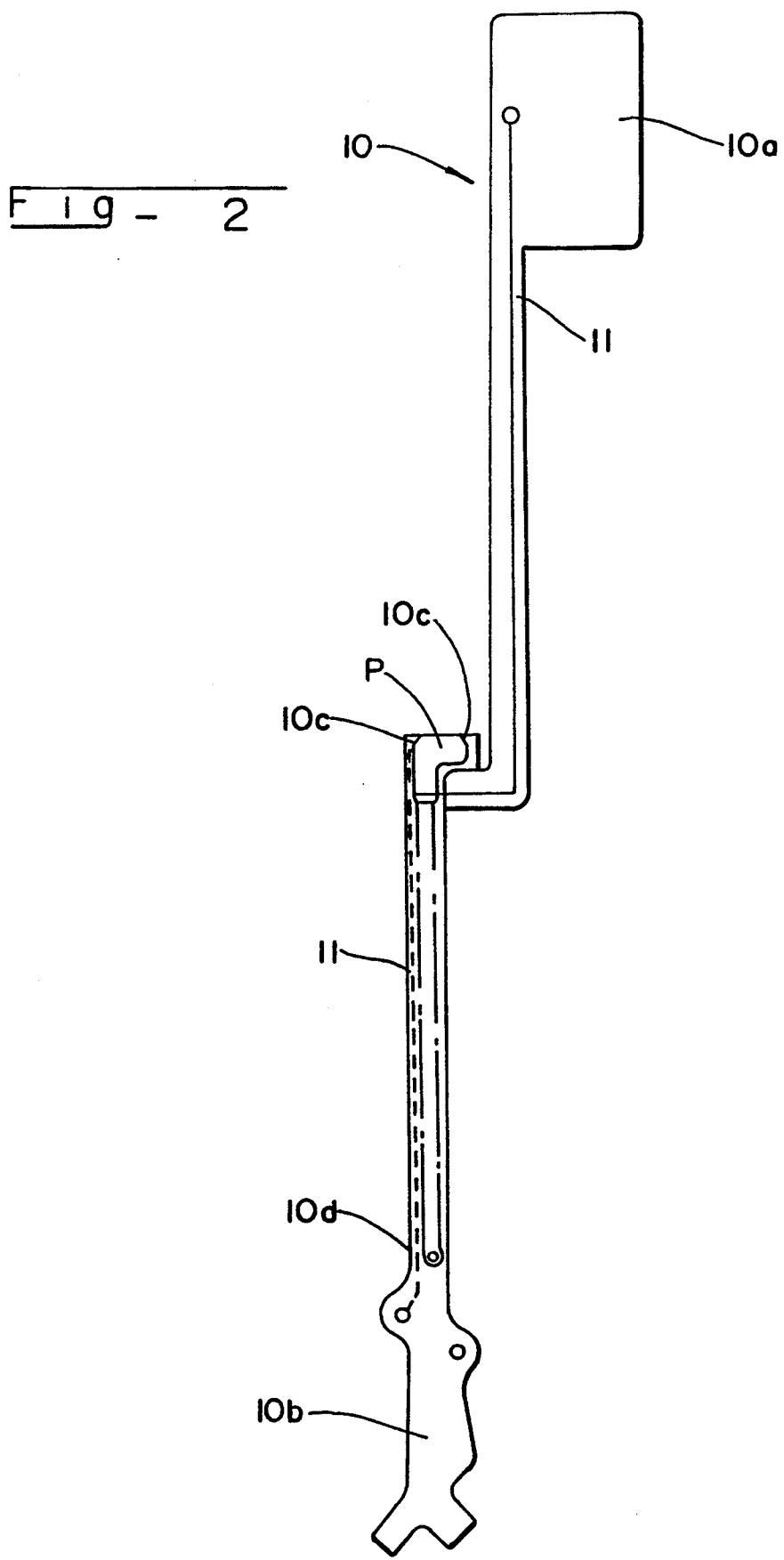

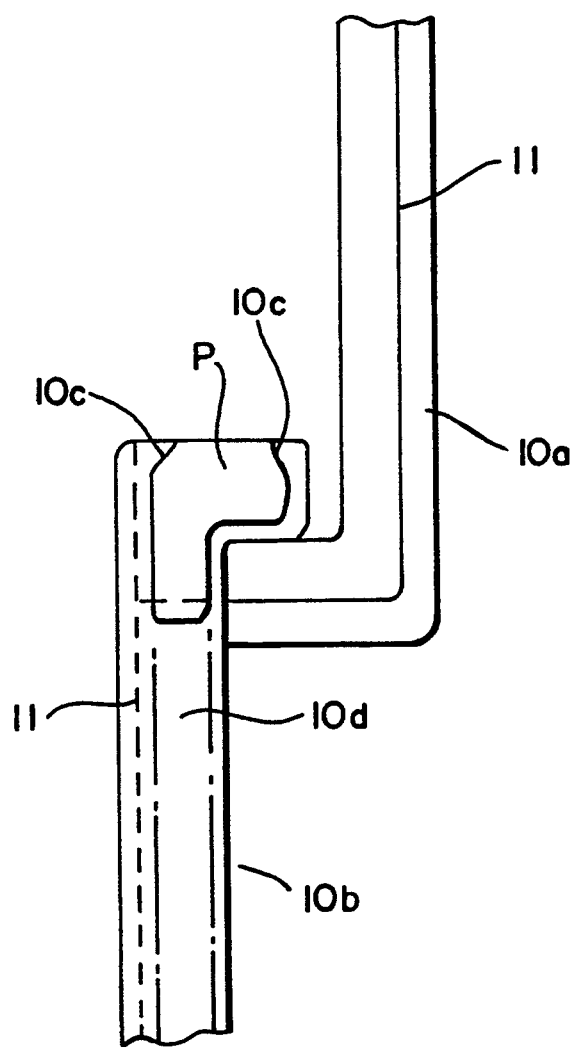

FLEXIBLE PRINTED CIRCUIT BOARD

FIELD OF THE INVENTION

The present invention relates to a flexible printed circuit board for use in interconnecting electronic circuit components in electronic devices.

BACKGROUND OF THE INVENTION

Recent advances in miniaturization of various electronic devices have resulted in a widespread use of flexible printed circuit (FPC) boards, which are also referred to as flexible printed wiring boards, for efficiently minimizing the area or space which is necessary to accommodate interconnected electronic circuits. The FPC boards are usually used inside the housing of an electronic device. Because of the restricted space available within such a housing for installing a FPC board, there are limitations imposed on the position where the FPC board may be placed in the housing. Usually, a small electronic device is required to employ a plurality of FPC boards having complex shapes that are bent or folded in a complex pattern so as to fit in the limited space available in the device housing.

Heretofore, if a FPC board is to be bent or folded in use, extra considerations were required when designing the circuit pattern, as well as additional manufacturing processes in order to produce the finished board.

In order to have a flexible board maintain its shape when bent, a rigid support is required. To accomplish this, the copper metal which forms the lead lines can provide the rigid support if there is a large enough area of the copper metal in the portion to be folded. To ensure that a large enough area of copper is provided, many lead lines must pass through the area to be folded. This creates a problem in that the designer must reroute the lead lines through the portion to be folded in order that enough area of copper metal is provided to properly maintain the folded shape. The rerouting of the lead lines requires extra design time and may lead to a layout that is not as efficient as the designer wanted. An increase in the number of lead lines passing through the portion to be folded will result in an increase in the overall width of the portion to be folded since each lead line must be insulated, and thus physically separated from each other.

Additionally, this is followed by removal of a portion of the outside substrate, thus weakening the board and reducing its effective lifetime. The board is then bent and held in the desired shape while a sealant is added to the area where the substrate was removed. The board is then held in the desired shape until the sealant hardens.

Thus extra design work is involved to ensure that the proper concentration of lead lines passes through the area to be folded. Extra manufacturing processes are required in bending the board and maintaining its position while a sealant is added and allowed to dry.

Thus the process to design and manufacture a flexible printed circuit board is time consuming and therefore not very productive.

SUMMARY OF THE INVENTION

It is therefore an object of the present invention to provide a flexible printed circuit board which can be bent or folded into a desired shape, and maintain this desired shape without requiring any special design considerations or any further processes and thus increase the productivity of manufacturing the circuit board.

According to the present invention, there is provided a flexible printed circuit board including a flexible sheet having a printed circuit pattern formed of an electrically conductive material on the sheet, which further includes a fold retainer pattern formed of the electrically conductive material of the sheet, the fold retainer pattern is electrically isolated from the printed circuit pattern. The fold retainer pattern maintains its folded shape once the flexible sheet is folded over.

According to a further aspect of the invention the flexible sheet may have a plurality of electrically conductive layers, with a printed circuit pattern formed in at least one of the electrically conductive layers. Further, the fold retainer pattern may also be formed in more than one of the electrically conductive layers, the additional fold retainer patterns adding more support to the folded flexible printed circuit board after it has been folded.

DESCRIPTION OF THE ACCOMPANYING DRAWINGS

FIG. 1 is a plan view of a flexible printed circuit board embodying the present invention;

FIG. 2 is a plan view of the flexible printed circuit board of FIG. 1 after it is folded over; and FIG. 3 is an enlargement of the folded over portion of the flexible printed circuit board shown in FIG. 2.

DESCRIPTION OF THE EMBODIMENT

In FIG. 1, a flexible printed circuit (FPC) board comprising a flexible sheet 10, embodying the present invention, is shown as being unfolded prior to use. When the FPC board 10 is unfolded, it is of a substantially U-shape, and includes two portions 10a and 10b. When the FPC board 10 is assembled in an electronic device (not shown), the portion 10b of the FPC board 10 is folded over about a fold line (fold) B, indicated by the dot-and-dash line, into an elongated shape as shown in FIG. 2.

The printed circuit pattern 11 is formed from a layer of an electrically conductive material such as copper. A fold retainer pattern P is also formed from the electrically conductive material across the fold line B, and is electrically-isolated from the printed circuit pattern. The fold retainer pattern P has an area which formed to cover substantially a whole area to be folded and is large enough to provide enough rigidity such that the FPC board keeps its folded shape once it is folded over.

Therefore, when the portion 10b of the FPC board 10 is folded over, the fold retainer pattern P, is also folded over and keeps the FPC board 10 folded about the fold line B, against the tendency of the FPC board 10, to regain its original, unfolded shape. The fold retainer pattern P has a pair of fold indicator notches 10c defined in respective opposite edges thereof in alignment with the fold line B. The portion 10b of the FPC board 10 is manually folded over across the fold indicator notches 10c. When the portion 10b is folded over, across the fold line B into the shape shown in FIG. 2, the fold retainer pattern P is also folded over, across the fold indicator notches 10c (see FIG. 3). Since the fold retainer pattern P is rigid enough not to recover its original orientation, the FPC board 10, once folded over, is maintained in its folded configuration regardless of its own tendency to restore its original unfolded shape.

The FPC board 10 is not limited to the illustrated shape, but may be a variety of shapes insofar as at least one circuit or wiring pattern can be printed on its electrically conductive layer.

The fold retainer pattern P may be connected to a ground contact. For example, as shown in FIG. 2, a contact pattern 10d extending from the fold retainer pattern P, may be connected to a ground contact (not shown). The fold retainer pattern P, for which is connected to a ground contact, may double as an electromagnetic shield in the vicinity of the fold line B. This especially improves the performance of high frequency circuits.

The fold retainer pattern can also be employed in a flexible printed circuit board having a plurality of conductive layers, commonly referred to as a multilayered FPC board. These boards allow a higher density of circuits per given area.

When these FPC boards are to be folded, a similar concept to that described above may be employed. At least one of the conductive layers must have the fold retainer pattern P provided therein. However for extra rigidity two or more layers may have the fold retainer pattern P.

As described above, since the FPC board 10, once folded over about the fold line B, keeps its folded shape, it is not necessary to remove a portion of the substrate material from the flexible circuit board or apply a seal to the folded corner or edge to keep the FPC board 10 folded over. Furthermore no extra design work is necessary such that a high concentration of lead lines passes through the area to be folded. Therefore, the FPC board 10 can be manufactured with a high productivity and easily assembled into an electronic device having a limited space.

Since an electrically isolated fold retainer pattern P is employed by this invention, the lead lines that pass through the folded area can be few in number and thus degradation of signal, due to the antenna effect common in high frequency signal lines having bent edges, is considerably reduced.

Inasmuch as the fold retainer pattern P is made of the same electrically conductive material as the printed circuit pattern on the FPC board 10, the fold retainer pattern P can easily be formed without increasing the number of steps of manufacturing the FPC board 10. Consequently, the fold retainer pattern P causes no substantial increase in the cost of the FPC board 10.

The present disclosure relates to subject matter contained in Japanese Utility Model Application No. HEI 4-47716, filed on Jul. 8, 1992, which is expressly incorporated herein by reference in its entirety.

What is claimed is:

1. A flexible printed circuit board comprising a flexible sheet having a printed circuit pattern formed of an electrically conductive material on said flexible sheet, which further comprises a fold retainer pattern formed of electrically conductive material on said flexible sheet, said fold retainer pattern on said flexible sheet being electrically isolated from said printed circuit pattern, said fold retainer pattern maintaining its folded shape once said flexible sheet is folded over.

2. The flexible printed circuit board according to claim 1, wherein said fold retainer pattern has a fold indicator to indicate a line where said flexible sheet is to be folded.

3. The flexible printed circuit board according to claim 2, wherein said fold indicator comprises a pair of notches defined in respective opposite edges of said fold retainer pattern and in alignment with said line where said flexible sheet is to be folded.

4. The flexible printed circuit board according to claim 1, wherein said fold retainer pattern is physically separated from said printed circuit pattern.

5. The flexible printed circuit board according to claim 1, wherein said fold retainer pattern is extended to cover a predetermined area and connected to a ground terminal.

6. The flexible printed circuit board according to claim 1, wherein said printed circuit pattern is formed on one side of said flexible sheet, while said fold retainer pattern is formed on another side of said flexible sheet.

7. The flexible printed circuit board according to claim 1, wherein said printed circuit pattern and said fold retainer pattern are formed on a same side of said sheet.

8. The flexible printed circuit board according to claim 1, wherein said fold retainer pattern is formed so as to cover substantially a whole area of said flexible sheet wherein a fold is located.

9. The flexible printed circuit board according to claim 1, wherein said fold retainer pattern is formed solely to maintain a folded configuration of said printed circuit board.

10. A flexible circuit board comprising a flexible sheet a printed circuit pattern formed of an electrically conductive material provided on said flexible sheet, and a fold retainer pattern formed of an electrically conductive material provided on said flexible sheet, said fold retainer pattern and said printed circuit pattern being electrically isolated from each other and being folded together with said flexible sheet, when said flexible sheet is folded over.

11. The flexible circuit board according to claim 10, said flexible printed circuit board comprising a plurality of conductive layers, at least one of said conductive layers having said fold retainer pattern provided thereon.

12. The flexible circuit board according to claim 10, said fold retainer pattern comprising an electromagnetic shield.

13. The flexible printed circuit board according to claim 10, said fold retainer pattern comprising means for ensuring that said flexible sheet maintains a folded shape, once said flexible sheet is folded.

14. The flexible printed circuit board according to claim 10, said fold retainer pattern defining a fold indicator for indicating where said flexible sheet is to be folded.

15. The flexible printed circuit board according to claim 14, said fold indicator comprising a pair of notches defined in respective opposite edges of said fold retainer pattern.

16. The flexible printed circuit board according to claim 10, said fold retainer pattern being connected to a ground terminal.

17. The flexible circuit board according to claim 10, said flexible printed circuit board comprising a plurality of conductive layers, at least one of said conductive layers having said fold retainer pattern provided thereon.

18. A flexible printed circuit board comprising a flexible sheet having a printed circuit pattern and a fold retainer pattern each formed of electrically conductive material, each of said patterns being formed on said sheet, said fold retainer pattern comprising means for maintaining a folded shape of said flexible sheet, once the flexible sheet is folded over.

19. The flexible printed circuit board according to claim 18, said fold retainer pattern defining a fold indicator for indicating where said flexible sheet is to be folded.

20. The flexible printed circuit board according to claim 19, said fold indicator comprising a pair of notches defined in respective opposite edges of said fold retainer pattern.

* * * * *

UNITED STATES PATENT AND TRADEMARK OFFICE
CERTIFICATE OF CORRECTION

PATENT NO.   : 5,398,163
DATED        : March 14, 1995
INVENTOR(S)  : Masaki SANO It is certified that error appears in the above-indentified patent and that said Letters Patent is hereby corrected as shown below:

At column 4, line 17 (claim 7, line 3), change "said" to ---said flexible---.

Signed and Sealed this

Fifth Day of September, 1995

Attest:

BRUCE LEHMAN

Attesting Officer

Commissioner of Patents and Trademarks